US006940363B2

(12) United States Patent
Zipper et al.

(10) Patent No.: US 6,940,363 B2
(45) Date of Patent: Sep. 6, 2005

(54) SWITCH ARCHITECTURE USING MEMS SWITCHES AND SOLID STATE SWITCHES IN PARALLEL

(75) Inventors: Eliav Zipper, Tel-Aviv (IL); Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 294 days.

(21) Appl. No.: 10/322,290

(22) Filed: Dec. 17, 2002

(65) Prior Publication Data

US 2004/0113713 A1 Jun. 17, 2004

(51) Int. Cl.[7] .............................. H01P 1/10; B81B 7/04
(52) U.S. Cl. ........................ 333/103; 333/101; 333/262
(58) Field of Search ................................ 333/101, 103, 333/262, 105

(56) References Cited

U.S. PATENT DOCUMENTS

| | | | | |
|---|---|---|---|---|
| 5,619,061 A | * | 4/1997 | Goldsmith et al. | 257/528 |
| 5,943,223 A | | 8/1999 | Pond | |
| 6,054,659 A | | 4/2000 | Lee et al. | |
| 6,066,993 A | * | 5/2000 | Yamamoto et al. | 333/103 |
| 6,591,139 B2 | * | 7/2003 | Loftin et al. | 607/60 |
| 2002/0118495 A1 | | 8/2002 | Beckert et al. | |

FOREIGN PATENT DOCUMENTS

| | | | |
|---|---|---|---|
| DE | 100 18 340 | A1 | 10/2001 |
| EP | 1 227 534 | A1 | 7/2002 |
| EP | 1 255 268 | A1 | 11/2002 |
| WO | WO 0209224 | A1 | 1/2002 |

OTHER PUBLICATIONS

Elliott R. Brown, "RF–Mems Switches for Reconfigurable Integrated Circuits," IEEE Transactions on Microwave Theory and Techniques, IEEE, vol. 46, No. 11, Nov. 1998, pp. 1868–1880, USA.

* cited by examiner

*Primary Examiner*—Robert Pascal
*Assistant Examiner*—Dean Takaoka
(74) *Attorney, Agent, or Firm*—Kevin A. Reif

(57) ABSTRACT

In a switching scheme mechanical MEMs switches are connected in parallel with solid state switches. This parallel MEMS/solid-state switch arrangement takes advantage of the fast switching speeds of the solid state switches as well advantage of the improved insertion loss and isolation characteristics of the MEMS switches. The solid-state switches only need to be energized during a ramp up/down period associated with the slower MEMs switch thus conserving power. As an additional advantage, using a solid-state switch in parallel with MEMs switches improves the transient spectrum of the system during switching operations.

13 Claims, 8 Drawing Sheets

SWITCH ARCHITECTURE USING MEMS SWITCHES AND SOLID STATE SWITCHES IN PARALLEL

FIELD OF THE INVENTION

An embodiment of the present invention is related to switches and, more particularly, to switches comprising micro-electromechanical system (MEMS) switches in parallel combination with solid state switches.

BACKGROUND INFORMATION

There are many applications which require fast switching speeds. For example, for multi-mode multi-band cell phone applications such as GSM (Global System for Mobile Communications), GPRS (General Packet Radio Service), and 3G (Third Generation Wireless), the antenna switch unit switches the antenna to different bands as well as between transmission (TX) and receiving (RX) modes. Currently, solid-state switches are used for this purpose. While RF (Radio Frequency) MEMS metal contact series switches generally have much better insertion loss and isolation characteristics, they are much slower than solid-state switches.

Referring to FIGS. 1A and 1B, these figures illustrate a side view and a top view of a MEMS in-line cantilever beam metal contact series switch, respectively. This type of MEMs switch can be manufactured by well known MEMS fabrication processes.

As shown, the switch is formed on a substrate 100. A metalized signal line 102 may be formed on one side of the substrate 100 and a second signal line 104 may be formed on the second side of the substrate 100. A cantilevered beam 106 may be secured to the second signal line 104. A bump (electrode) 108 may be formed on the underside of the cantilevered beam 106 over the first signal line 102. An actuation plate 110 may be formed on the substrate 100 beneath the cantilevered beam 106. When the actuation plate 110 is energized, by applying a voltage on the actuation lead 112, the cantilevered beam 106 is pulled downward causing the bump 108 to make electrical contact with the first signal line 102. This closes the switch and provides an electrical signal path between the first signal line 102 and the second signal line 104.

For Tx/Rx switching, speeds of a few micro-seconds are typically needed. To reach such speeds for MEMS switches, the switch structure (i.e., the cantilevered beam 106) should preferably be very stiff so the mechanical resonance frequency is high. This also means the actuation voltage required for the switch is higher (40–100V) to overcome the stiffness. In such cases, high voltage driver chips may be required. Such driver chips may be fabricated using special CMOS processes to achieve this activation voltage. These are often expensive and add to the total cost of the switch module.

DETAILED DESCRIPTION

Solid state switches and MEMS switches both have advantages and disadvantages in certain switching applications. In particular, high speed, solid state switches, which use semiconductor components and contain no moving parts are fast and relatively inexpensive to manufacture. They also require less power to operate than MEMs switches. However, the solid-state switches tend to exhibit higher insertion losses than MEMS switches. Insertion loss refers to the power loss experienced by a signal between the switch input and the switch output. MEMS switches typically have lower, and therefore better, insertion loss characteristics. However, MEMs switches tend to be more costly to manufacture and consume more power to operate than solid state switches for high speed applications.

Table 1 provides a comparison between characteristics of a solid state antenna switch and a MEMS RF (radio frequency) switch according to one example embodiment.

TABLE 1

MEMS vs. Solid State Switches

| | Insertion Loss (dB) | Isolation (dB) | Permissible Input Power | Speed ($\mu$s) |
|---|---|---|---|---|
| Solid State Switch | >0.8 | <25 | 2 Peak | <0.1 |
| MEMS RF Switch | <0.3 | >35 | 2 Peak | 5–25 |

Figure 1A:
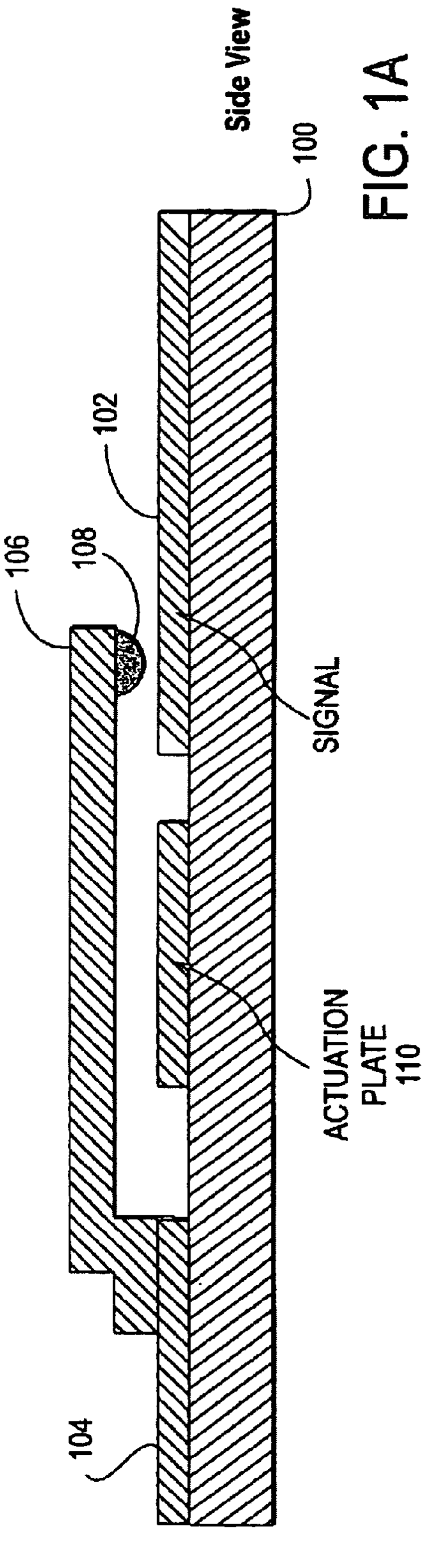
FIGS. 1A and 1B are side and top views, respectively, of a MEMS switch.
Figure 1B:
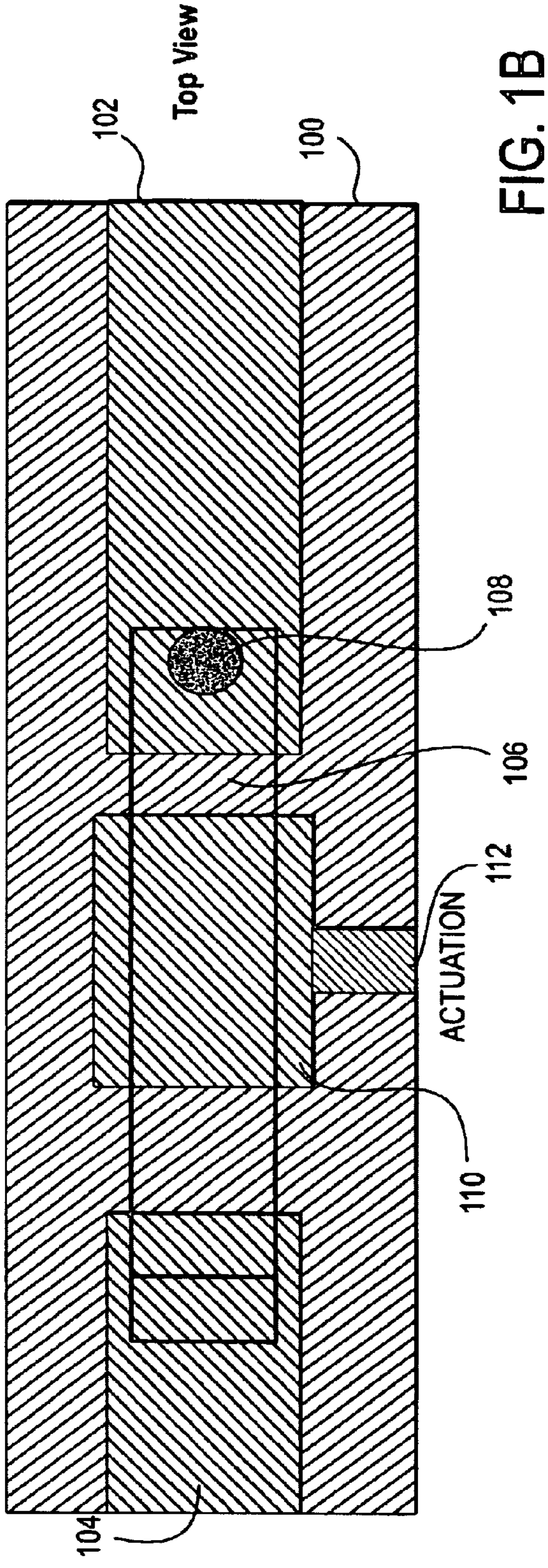
Figure 2:
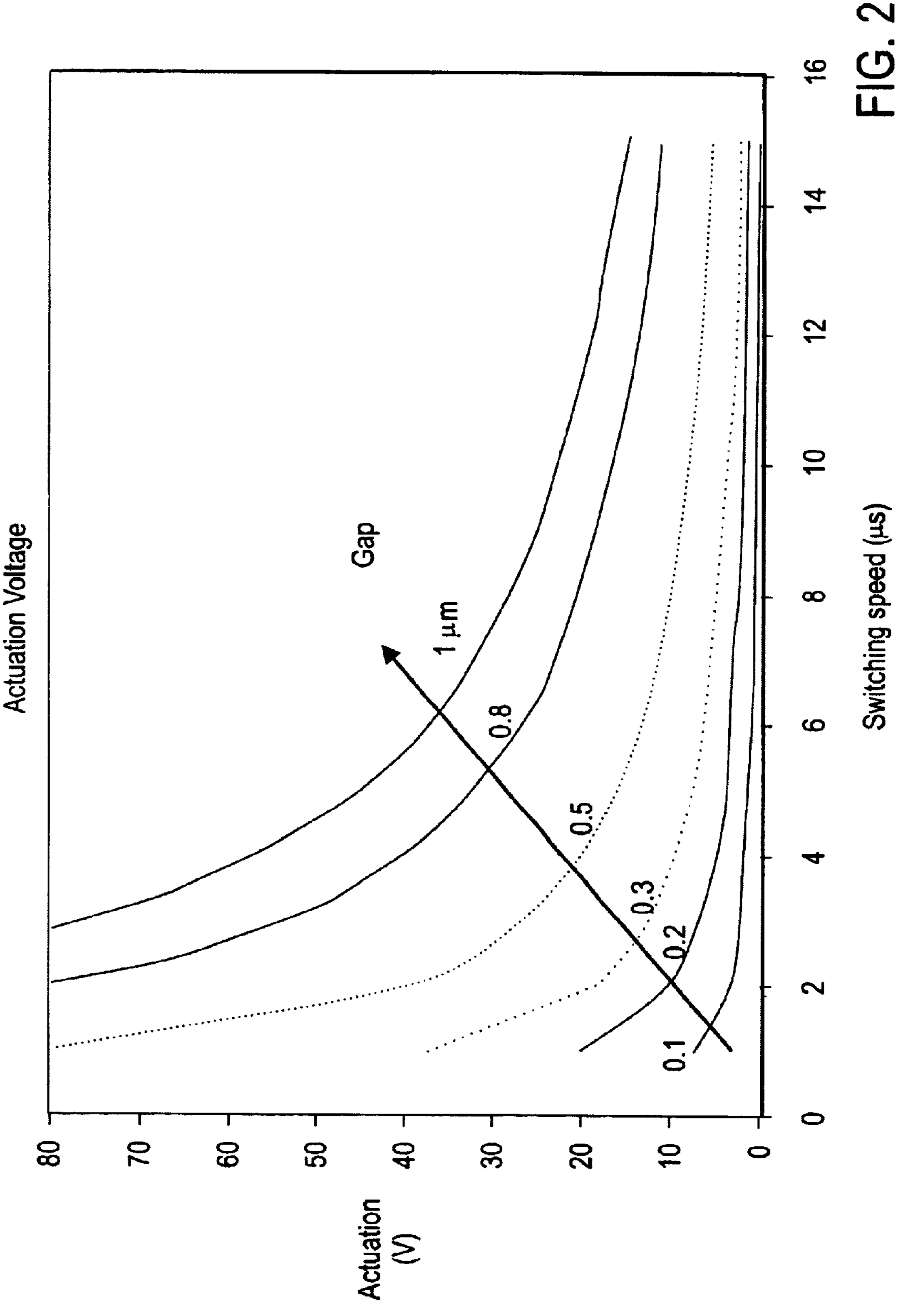
FIG. 2 is a diagram plotting actuation voltage vs. switching speed and showing the gap size for a MEMS switch.

As shown in the table, MEMS switches have a much better insertion loss but the tradeoff is that MEMs switches are typically much slower. In fact, MEMs switches may be too slow for some high speed applications such as antenna switching applications and the like. Moreover, as shown in FIG. 2, in order to make faster MEMS switches, they are generally made stiffer thus requiring a larger actuation voltage. In some cell phones, the highest voltage is about 15V, used for the display. In addition, many CMOS processes are capable of producing 15–20V, but typically not much higher. For practical gap sizes (0.5–1 um), referring to the gap between the bump 108 and the contact signal line contact 102 (FIG. 1A), a 15V actuation voltage has a switching time considerably greater than 8 $\mu$s without even considering switch settling time.

Figure 3:
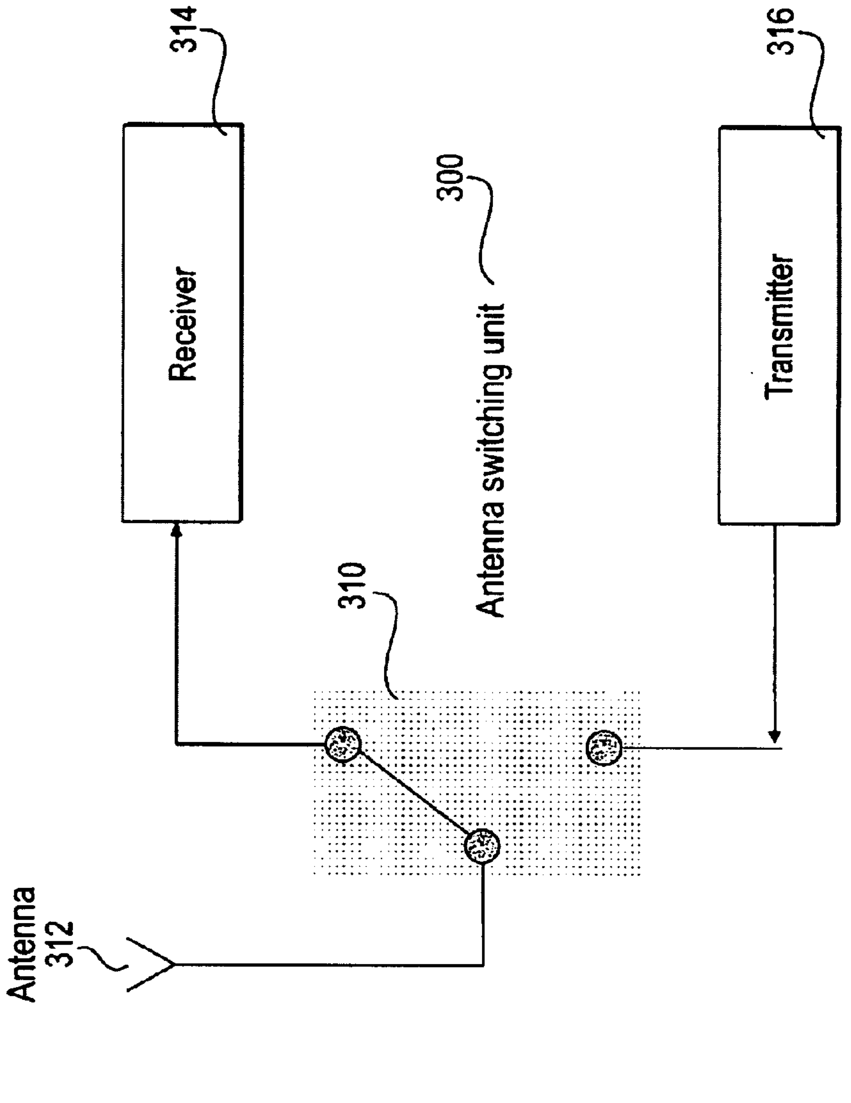
FIG. 3 is a block diagram of a single-pole, double throw antenna switch.

FIG. 3 is a simple block diagram of a single pole double throw antenna switching unit 300 for a single band GSM cell phone. The switch 310 simply switches the antenna 312 between a receiver 314 and a transmitter 316. However, when MEMS switches are used, each individual switch may not be able to carry sufficient current for GSM transmission.

Figure 4:
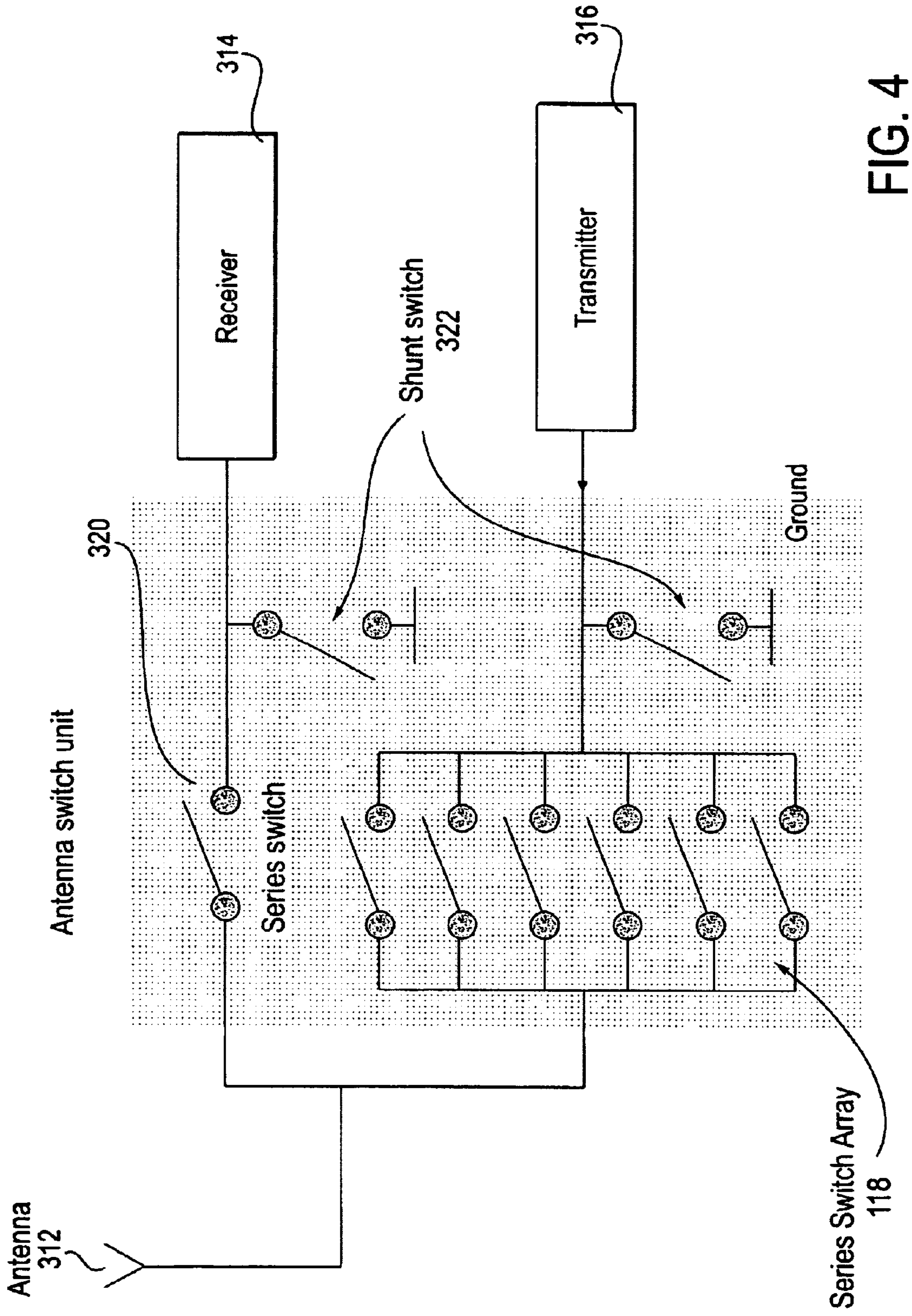
FIG. 4 is a block diagram of an antenna switching unit using a solid-state switching array for TX mode and a single solid-state switch for RX mode.

Thus, as shown in FIG. 4, a series switch array 318 is used for transmission (TX) while a single switch 320 may still be used for reception (RX). Also, to improve isolation, shunt switches 322 may also be used. To improve isolation, these shunt switches 322 connect either the receiver 314 or the transmitter 316 to ground when the respective shunt switch 322 is closed.

In order to take advantage of the desirable features of both types of switches, one embodiment of the invention provides an architecture using MEMS switches and solid-state switches in parallel. According to an embodiment, faster switching speed may be achieved by the solid-state switch, lower insertion loss may be achieved by MEMS series switches, and a high isolation may be achieved by the MEMS shunt switches.

Figure 5:
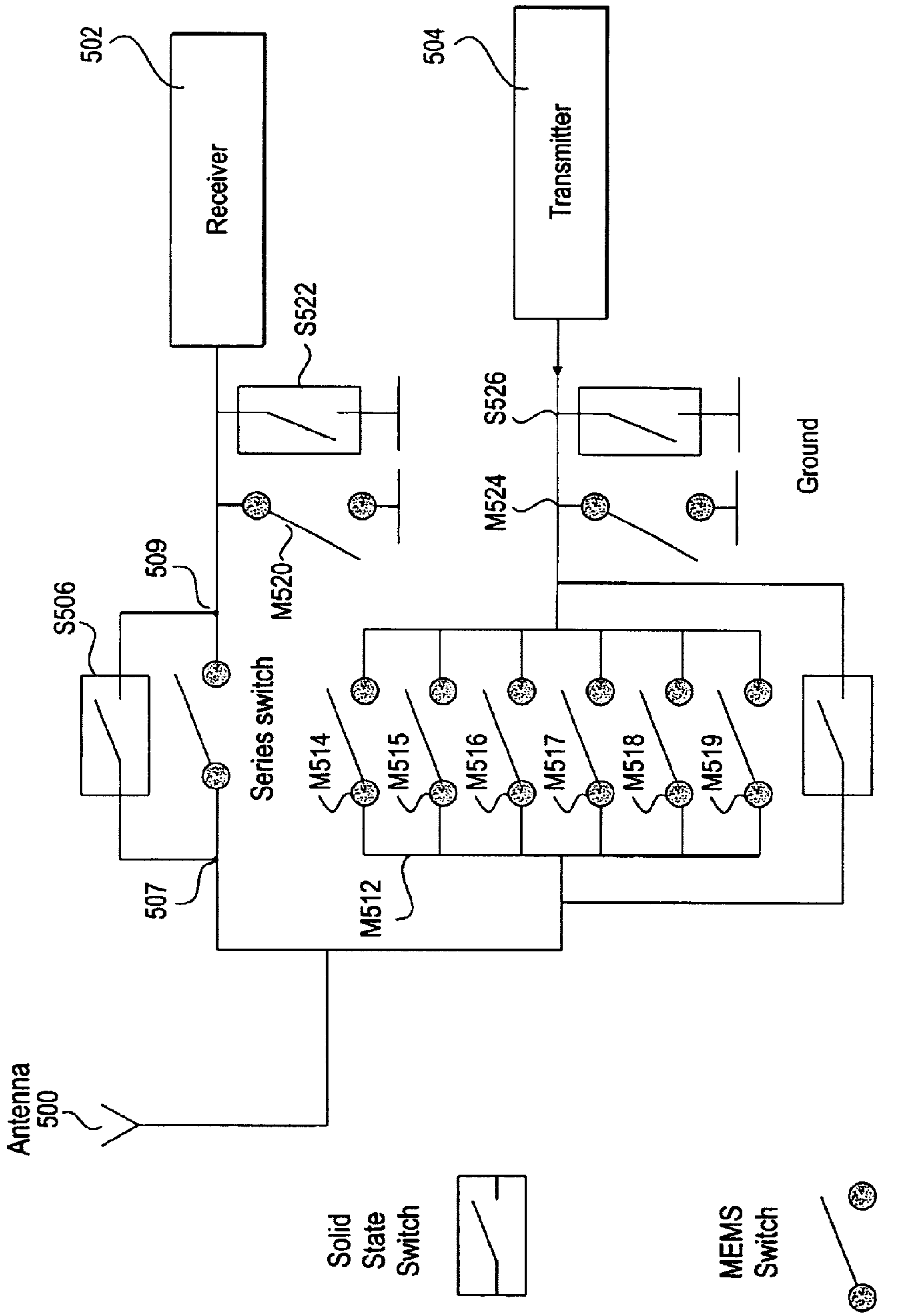
FIG. 5 is a block diagram of an antenna switching unit using solid-state switches and MEMS in parallel combinations according to one embodiment of the present invention.

Referring now to FIG. 5, an antenna 500 is connected to either a receiver 502 or a transmitter 504 by sets of MEMS switches (M) and solid-state switches (S) connected in parallel. As shown, the receiver 502 is connected to the antenna 500 via a solid-state switch S506 and a MEMS switch M508 connected in parallel. Similarly, the transmitter connects to the antenna 500 via a solid-state switch S510 and an array of MEMS switches M512 connected in parallel with the solid-state switch S510. The MEMS switch array M512 comprises a plurality of MEMS switches (six shown here for illustration purposes, M514–M519) in order to accommodate higher currents required for transmission. However, additional switches or fewer switches may be used in the MEMs switch array M512 depending on the transmission current for a particular application.

In order to improve isolation characteristics of the receiver 502, a shunt circuit may be used comprising a MEMS switch M520 and a solid-state switch S522 which may be advantageously connected in parallel to shunt the receiver 502 to ground when it is disconnected from the antenna 500. Similarly, in order to improve isolation characteristics of the transmitter 504 a second shunt circuit comprising a MEMS switch M524 and a solid-state switch S526 connected in parallel may also be used to shunt the transmitter 504 to ground when it is disconnected from the antenna 500.

In its simplest form, an embodiment of the invention may comprise a first contact 507 to connect to a first electrical device (in this case and antenna 500) and a second contact 509 to connect to a second electrical device (in this case either a receiver 502 or a transmitter 504). A faster switch, such as a solid-state switch S506, may be connected between the first contact 507 and the second contact 509. And, a slower switch, such as a mechanical (MEMs) switch M508 may also be connected between the first contact 507 and the second 509 contact in parallel connection with said solid-state switch S506. This parallel MEMS/solid-state switch arrangement takes advantage of the fast switching times of the solid state switches as well advantage of the improved insertion loss and isolation characteristics of the MEMS switches. As an additional advantage, using a solid-state switch in parallel with MEMs switches improves the transient spectrum of the system during switching operations.

Figure 6:
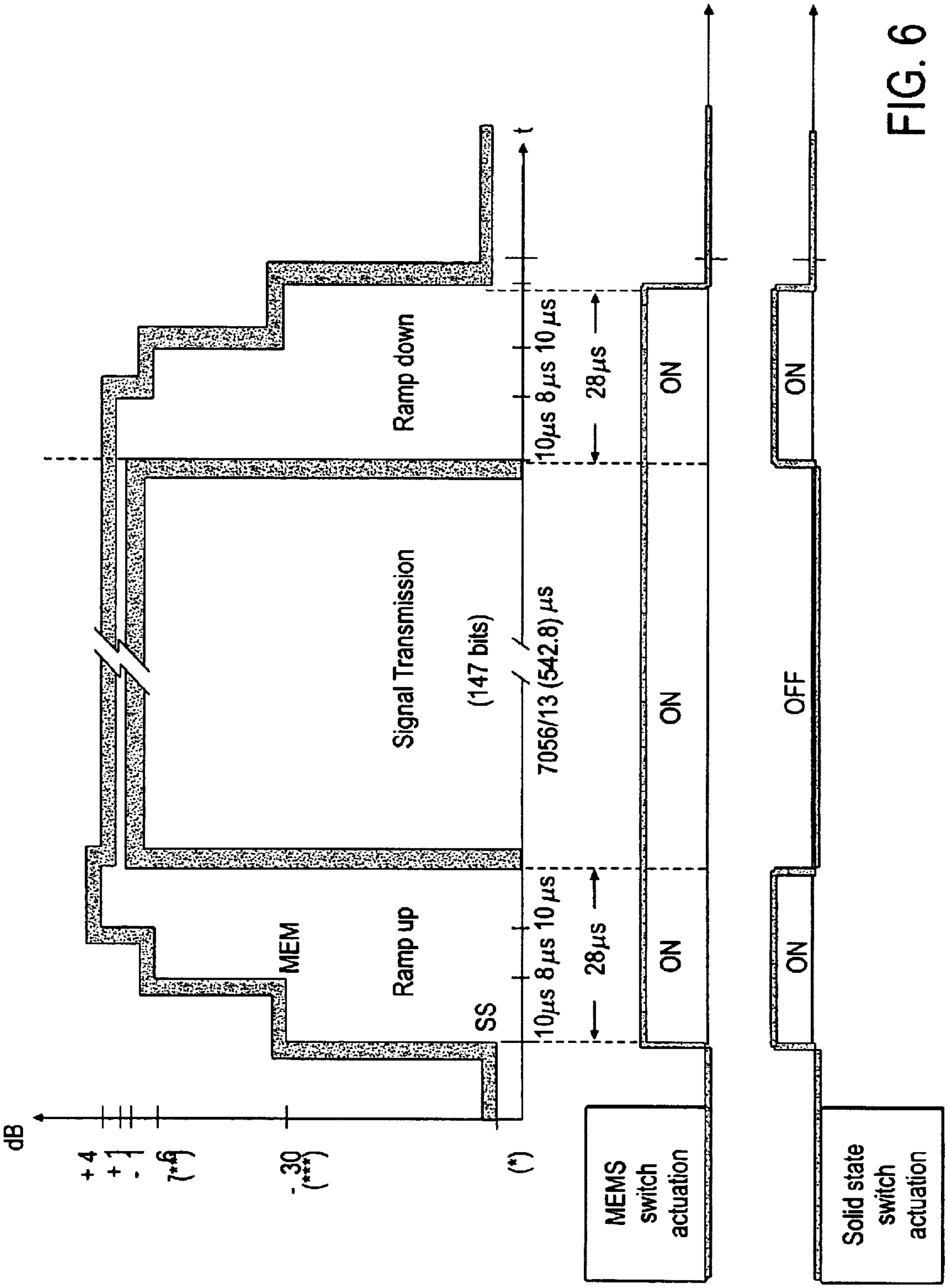
FIG. 6 is a diagram showing the MEMS and solid-state switching sequence during ramp up/down and during signal transmission.

As an example, referring to FIG. 6, for GSM/GPRS (Global System for Mobile Communications/General Packet Radio Service) applications, the transmission power ramp-up and ramp-down period is 28 $\mu$S. Therefore, in principle using MEMS switches would be satisfactory as long as the MEMS switch can be switched on or off within the ramping period. For a 28 uS switching time, the actuation voltage for MEMS switches can be reduced to below 15 V. Actuation voltage supply chips below 15V can be fabricated using ordinary CMOS processes and therefore may be economically produced. Further for this actuation voltage range, it is possible to use voltage sources already in a cell-phone, since the display typically uses near 15 Volts.

However, even if the MEMs switches can be switched at an acceptable speed and at an acceptable actuation voltage, these relatively slow MEMS switches still severely disturb the transient spectrum during the ramp (up/down) period, which is unacceptable. Thus, this drawback is also resolved by using the solid state switches in parallel with MEMS switches so that the fast solid-state switches may cover the ramping period to avoid the transient spectrum problem. Since the solid-state switches are only needed during the ramping period and thereafter switched off, the low insertion loss MEMS switches cover the data transmission period while approximately 90% power for solid-state switching is saved. Thus, embodiments of the present invention may also reduce power consumption.

FIG. 6, taken with FIG. 5, shows a graph of the solid-state and MEMS switching during ramp-up and ramp down when switching either the receiver 502 or the transmitter 504 to the antenna 500. For GSM or enhanced GSM applications, 28 uS are allocated for ramp-up and ramp-down purposes. Thus, as long as the MEMS switching action can be completed during this ramping period it will be suitable. The faster switching solid-state switch in parallel is used to avoid transient spectrum problems. The disturbance caused by the MEMS switch on/off action will not degrade the transient spectrum appreciably, and can be compensated by pre-distortion in the ramp DAC (digital/analog converter). Pre-distortion is a technique used to compensate for amplifier non-linearity. Power amplifiers (PA) typically have some non-linear transfer function between its input and output. This non-lineartty should be compensated (to a certain level) to comply with the spectral emission requirements. Thus, pre-distortion may be considered a kind of an inverted function of the PA non-linearity.

In this example, by using this MEMS switch in parallel with solid-state switch structure, the speed requirement for MEMS switch is reduced and need only reach steady state within 28 uS. As shown, both the MEMS switch and the solid-state switch are turned on (i.e. closed) at the same time. The MEMS switch remains closed through the duration of the connection to the antenna and is responsible for carrying the signal transmission. In contrast, the solid state switch is only activated during the ramp-up period and the ramp-down period. In other words, throughout the entire switching cycle, the solid state switch is activated for 2*28 uS instead of (2*28+542.8)uS , which reduces the total power consumption (of the solid-state switch) by 90%. During the signal transmission period (542.8 uS), the low insertion loss advantage of the MEMS switch is realized.

Figure 7:
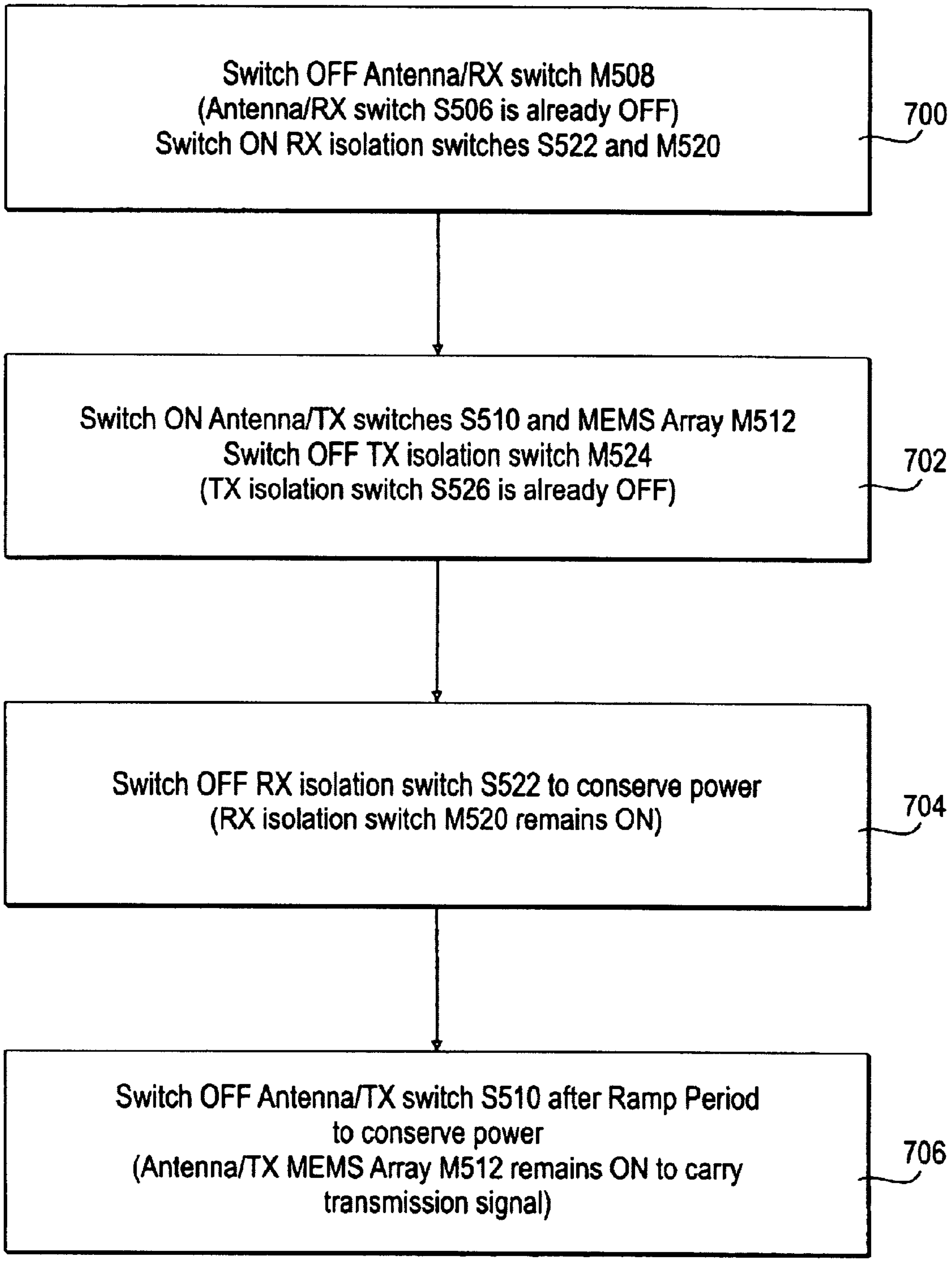
FIG. 7 is a flow diagram showing the RX to TX transition sequence.
Figure 8:
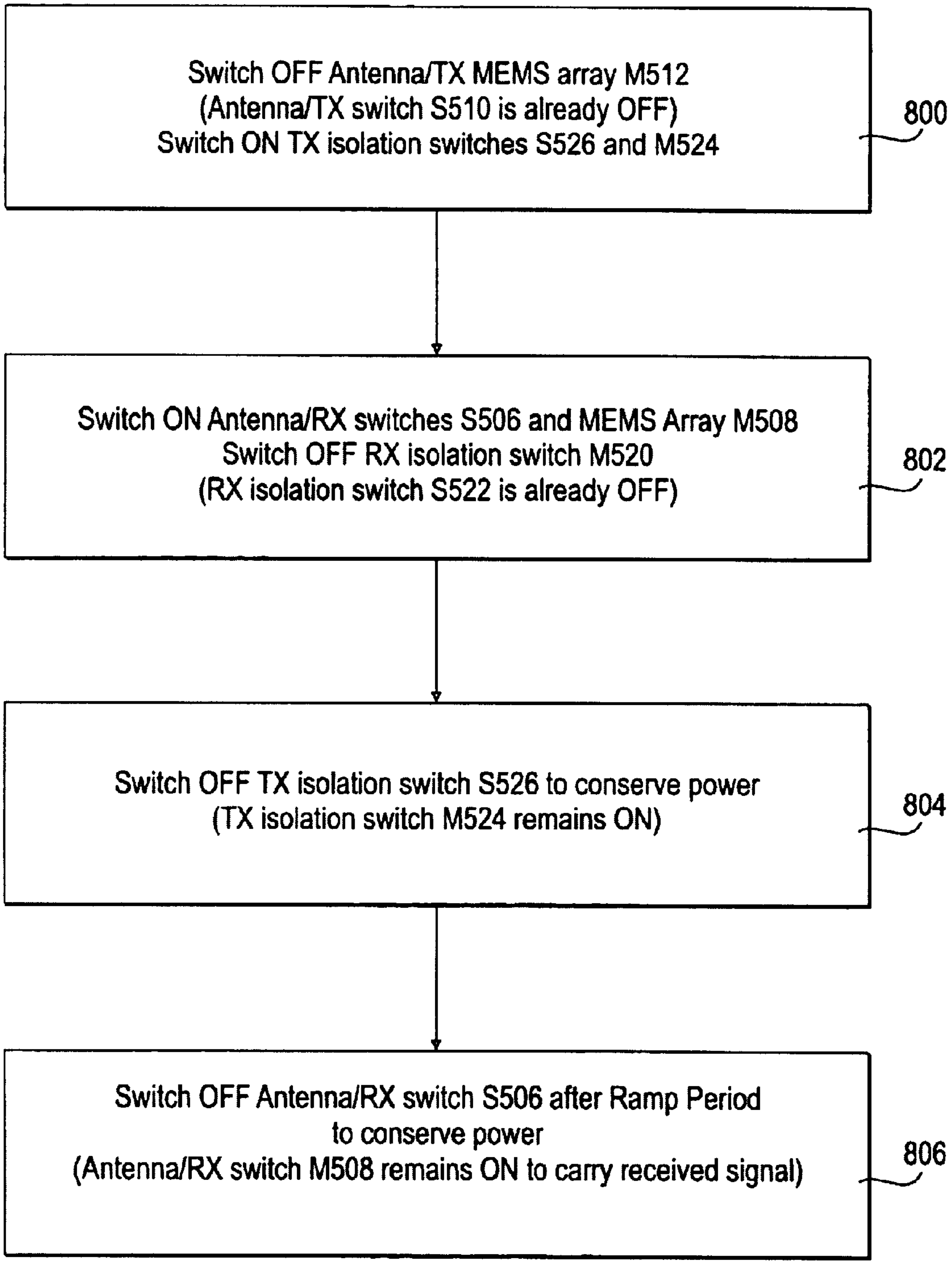
FIG. 8 is a flow diagram showing the TX to RX transition sequence.

FIG. 7 is a flow diagram illustrating the transition sequence when switching the antenna between the receiver and the transmitter. Conversely, FIG. 8 is a flow diagram illustrating the transition sequence when switching the antenna between the transmitter and the receiver. Various operations are described as multiple discrete blocks performed in turn in a manner that is helpful in understanding embodiments of the invention. However, the order in which they are described should not be construed to imply that these operations are necessarily order dependent or that the operations be performed in the order in which the blocks are presented.

Referring to FIG. 7, when switching the antenna 500 between the receiver 502 and transmitter 504, in block 700 a control signal switches off M508 (S506 is already in an off state) and S522 and M520 are switched on. In an on state, M520 provides better isolation for the receiver 502 when M508 is off. In block 702, control signals switch on S510 and the MEMS array M512 and S526 is switched off (M524 is already in an off state). In block 704, isolation switch S522 is switched off to conserve power, while isolation switch M520 remains on. Finally in block 706, S510 is switched off after the ramp period to conserve power and the MEMS array M512 carry the signal transmission.

Similarly, FIG. 8 show the transition sequence when switching the antenna between the transmitter 504 and the receiver 502. In block 800 a control signal switches off MEMS array switches M512 (S510 is already in an off state) and S526 and M524 are switched on to provide improved isolation for the transmitter 504. In block 802, a control signal switches on S506 and M508 to connect the receiver 502 to the antenna 500, and isolation switch M520 is switched off (isolation switch M520 is already in an off state). In block 804, transmitter isolation switch S526 is switched off to conserve power and isolation is provided by M524. Finally, in block 806, solid-state switch S506 is switched off after the ramp period to conserve power and the signal transmission from the antenna 500 to the receiver 502 is carried by the MEMS switch M508.

Embodiments of the present invention are specifically illustrated and/or described herein. However, it will be appreciated that modifications and variations of the present invention are covered by the above teachings and within the purview of the appended claims without departing from the spirit and intended scope of the invention.

We claim:

1. A switch circuit, comprising:

a first contact to connect to a first electrical device;

a second contact to connect to a second electrical device;

a solid-state switch connected between said first contact and said second contact;

a mechanical switch connected between said first contact and said second contact in parallel combination with said solid-state switch, said mechanical switch having a slower switching speed than said solid-state switch and having a ramp-up period when turned on and a ramp-down period when turned off; and a control sequence to turn on said solid-state switch during said ramp-up period and said ramp-down period.

2. The switch circuit as recited in claim 1, wherein said mechanical switch comprises:

an array of mechanical switches connected between said first contact and said second contact.

3. The switch circuit as recited in claim 1, further comprising:

a shunt circuit between said second contact and ground, said shunt circuit comprising:

a solid state switch; and a mechanical switch connected in parallel combination with said solid state switch.

4. The switch circuit as recited in claim 1 wherein said mechanical switch is a micro-electromechanical system (MEMs) switch.

5. A switch for a communication device, comprising:

an antenna;

a receiver;

a transmitter;

a first switch circuit to connect said antenna to said receiver, said first switch circuit comprising:

a solid-state switch; and a mechanical switch connected in parallel combination with said solid-state switch;

a second switch circuit to connect said antenna to said transmitter, said second switch circuit comprising:

a solid state switch; and an array of mechanical switches connected in parallel with said solid state switch.

6. The switch for a communication device as recited in claim 5, further comprising:

a receiver shunt circuit comprising a solid-state switch in parallel connection with a mechanical switch to shunt said receiver to ground when said first switch circuit is in an off state.

7. The switch for a communication device as recited in claim 6, further comprising:

a transmitter shunt circuit comprising a solid-state switch in parallel connection with a mechanical switch to shunt said transmitter to ground when said second switch circuit is in an off state.

8. The switch for a communication system as recited in claim 4 wherein said mechanical switches comprise micro-electromechanical system (MEMs) switches.

9. A method for switching, comprising:

providing a first switch between two electrical devices;

providing a second switch in parallel with said first switch, said second switch being faster than said first switch, said first switch having a ramp-up period when turned on and a ramp down period when turned off;

turning on said first switch; and turning on said second switch during said ramp-up period and turning off said second switch after said ramp-up period; turning off said first switch;

turning on said second switch during said ramp down period and turning off said second switch after said ramp-down period.

10. The method as recited in claim 9, further comprising:

providing a first isolation switch;

providing a second isolation switch in parallel with said first isolation switch, said second isolation switch being faster than said first isolation switch, said first isolation switch having a ramp-up period when turned on;

turning on said first isolation switch and said second isolation switch when said first switch and said second switch are turned off; and turning off said second isolation switch after said ramp-up period of said first isolation switch.

11. The method as recited in claim 9, wherein said first switch comprises a micro-electromechanical system (MEMs) switch and said second switch comprises a solid-state switch.

12. The method as recited in claim 10, wherein said first isolation switch comprises a micro-electromechanical system (MEMs) switch and said second isolation switch comprises a solid-state switch.

13. The method as recited in claim 11, wherein said second switch comprises an array of second switches.

* * * * *